US012620560B2

(12) United States Patent
Yoo et al.

(10) Patent No.: US 12,620,560 B2
(45) Date of Patent: May 5, 2026

(54) APPARATUS FOR TREATING SUBSTRATE AND METHOD FOR ALIGNING DIELECTRIC PLATE USING THE SAME

(71) Applicant: PSK INC., Hwaseong-si (KR)

(72) Inventors: Kwang-Sung Yoo, Hwaseong-si (KR); Ju-Young Park, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 493 days.

(21) Appl. No.: 18/022,549

(22) PCT Filed: Oct. 29, 2021

(86) PCT No.: PCT/KR2021/015421
§ 371 (c)(1),
(2) Date: Feb. 22, 2023

(87) PCT Pub. No.: WO2023/027245
PCT Pub. Date: Mar. 2, 2023

(65) Prior Publication Data
US 2024/0274409 A1      Aug. 15, 2024

(30) Foreign Application Priority Data
Aug. 25, 2021    (KR) ........................ 10-2021-0112160

(51) Int. Cl.
*H01J 37/32*          (2006.01)
(52) U.S. Cl.
CPC .. *H01J 37/32458* (2013.01); *H01J 37/32091* (2013.01); *H01J 37/32385* (2013.01);
(Continued)
(58) Field of Classification Search
CPC ............. H01J 37/32458; H01J 37/3244; H01J 37/32568; H01J 2237/2007;
(Continued)

(56) References Cited

U.S. PATENT DOCUMENTS 6,400,458 B1 * 6/2002 Howald ................ B24B 37/013
                                                    356/498
7,396,558 B2 * 7/2008 Fujimori .............. H10K 71/166
                                                    118/721
(Continued)

FOREIGN PATENT DOCUMENTS

CN        109300836 A      2/2019
JP       2003188145 A  *  7/2003
(Continued)

OTHER PUBLICATIONS

Office Action issued from Taiwanese Patent Application No. 110139759 issued on Aug. 25, 2021.
(Continued)

*Primary Examiner* — Aiden Lee
(74) *Attorney, Agent, or Firm* — Sughrue Mion, PLLC

(57)          ABSTRACT

An apparatus for treating a substrate includes a housing including an open top and a treatment space therein, a gas supply unit configured to supply gas to the treatment space, a support unit including a chuck configured to support the substrate in the treatment space and an upper electrode provided to surround the check when viewed from the top, a dielectric plate unit including a dielectric plate arranged to oppose the substrate supported by the support unit in the treatment space, an upper electrode unit coupled to the dielectric plate unit and including an upper electrode arranged to oppose the lower electrode, and an aligning unit configured to align a horizontal arrangement of the dielectric plate unit, in which a lid extending from the housing in the horizontal direction and coupled to the upper electrode unit is provided on the housing, and the aligning unit is coupled to the lid.

16 Claims, 7 Drawing Sheets

(52) U.S. Cl.
    CPC .... *H01J 37/3244* (2013.01); *H01J 37/32568*
        (2013.01); *H01J 2237/2007* (2013.01); *H01J*
        *2237/334* (2013.01)

(58) Field of Classification Search
    CPC ........... H01J 2237/334; H01J 37/32091; H01J
        37/32385; H01J 37/32; H01J 37/32651;
        H01L 21/68; H01L 21/67069
    See application file for complete search history.

(56)                 References Cited

U.S. PATENT DOCUMENTS

| | | | | |
|---|---|---|---|---|
| 7,575,638 | B2 * | 8/2009 | Bailey, III | ........ H01L 21/67069 |
| | | | | 156/345.46 |
| 7,858,898 | B2 | 12/2010 | Bailey, III et al. | |
| 10,431,429 | B2 * | 10/2019 | Kobayashi | .......... H01J 37/3244 |
| 2004/0108068 | A1 * | 6/2004 | Senzaki | ............ H01J 37/32458 |
| | | | | 156/345.43 |
| 2008/0179297 | A1 | 7/2008 | Bailey et al. | |
| 2008/0185105 | A1 | 8/2008 | Bailey et al. | |
| 2009/0126634 | A1 * | 5/2009 | Yamazawa | ........ H01J 37/32568 |
| | | | | 118/723 R |
| 2010/0236717 | A1 | 9/2010 | Chung et al. | |
| 2010/0282709 | A1 * | 11/2010 | Kang | ................. H01J 37/32091 |
| | | | | 216/13 |
| 2012/0270406 | A1 * | 10/2012 | Tahara | .............. H01J 37/32853 |
| | | | | 134/1.2 |
| 2019/0035671 | A1 | 1/2019 | Ha et al. | |
| 2022/0059324 | A1 | 2/2022 | Lee et al. | |

FOREIGN PATENT DOCUMENTS

| | | | |
|---|---|---|---|
| KR | 10-0911747 | B1 | 8/2009 |
| KR | 10-1346081 | B1 | 12/2013 |
| KR | 10-2275757 | B1 | 7/2021 |
| TW | 200845187 | A | 11/2008 |

OTHER PUBLICATIONS

International Search Report for PCT/KR2021/015421 dated May 20, 2022 (PCT/ISA/210).

* cited by examiner

APPARATUS FOR TREATING SUBSTRATE AND METHOD FOR ALIGNING DIELECTRIC PLATE USING THE SAME

CROSS REFERENCE TO RELATED APPLICATIONS

This application is a National Stage of International Application No. PCT/KR2021/015421 filed Oct. 29, 2021, claiming priority based on Korean Patent Application No. 10-2021-0112160 filed Aug. 25, 2021, the disclosures of which are incorporated herein by reference in their entireties.

TECHNICAL FIELD

The present disclosure relates to an apparatus for treating a substrate and a method of aligning a dielectric plate, and more particularly, to an apparatus for treating a substrate by using plasma and a method of aligning a dielectric plate provided in the apparatus.

BACKGROUND ART

Plasma is an ionized gas state including ions, radicals, electrons, etc., and is generated in response to very high temperatures, strong electric fields, or radio frequency (RF) electromagnetic fields. A semiconductor device manufacturing process includes an ashing or etching process to remove a film material from a substrate by using plasma. The ashing or etching process is performed by collision or reaction of ions and radical particles, contained in plasma, with a film material on the substrate. A process of treating a substrate by using plasma may be performed in various manners. A bevel etching apparatus for etching an edge region of the substrate treats the edge region of the substrate by irradiating plasma to the edge region of the substrate.

The bevel etching apparatus performs etching on the substrate by supplying a processing gas excited to a plasma state to the edge of the substrate. To prevent etching of other regions than the edge region of the substrate, a dielectric plate provided to an insulator is located on the substrate. To process the edge region of the substrate, adjustment of a relative position between the dielectric plate and the substrate is crucial.

However, separate inclusion of a structure for moving the dielectric plate causes spatial constraints in forming the interior of an existing bevel etching apparatus and increases the volume of the bevel etching apparatus.

DESCRIPTION OF EMBODIMENTS

Technical Problem

The present disclosure provides an apparatus for treating a substrate and a method of aligning a dielectric plate to efficiently control a relative position between an insulator and the substrate.

The present disclosure also provides an apparatus for treating a substrate and a method of aligning a dielectric plate, by which the efficiency of plasma treatment with respect to an edge region of the substrate may be further improved.

Problems to be solved by the present disclosure are not limited to the above-mentioned problems, and the problems not mentioned may be clearly understood by those of ordinary skill in the art to which the present disclosure belongs from the present specification and the accompanying drawings.

Solution to Problem

The present disclosure provides an apparatus for treating a substrate. In an embodiment, the apparatus for treating the substrate includes a housing including an open top and including a treatment space therein, a gas supply unit configured to supply a gas to the treatment space, a support unit including a chuck configured to support the substrate in the treatment space and an upper electrode provided to surround the check when viewed from the top, a dielectric plate unit including a dielectric plate arranged to oppose the substrate supported by the support unit in the treatment space, an upper electrode unit coupled to the dielectric plate unit and including an upper electrode arranged to oppose the lower electrode, and an aligning unit configured to align a horizontal arrangement of the dielectric plate unit, in which a lid extending from the housing in the horizontal direction and coupled to the upper electrode unit is provided on the housing, and the aligning unit is coupled to the lid.

In an embodiment, the aligning unit may include a body coupled to the lid and a plurality of aligning bolts provided to be inserted into a thread formed in the body and to push the upper electrode unit in the horizontal direction.

In an embodiment, the body may be provided in a form to be attachable to and removable from the lid.

In an embodiment, the lid may be provided in a ring shape, and the plurality of aligning bolts may be provided symmetrically with respect to a center of the lid.

In an embodiment, the lid and the upper electrode unit may be bolt-coupled to each other.

In an embodiment, the apparatus may further include a view port configured to penetrate the dielectric plate unit and an aligning mark provided on the support unit to correspond to the view port at a preset position.

In an embodiment, the view port may be provided at a position that does not overlap with the lid, when viewed from the top.

In an embodiment, the dielectric plate unit and the upper electrode unit may be configured to be coupled to a temperature control plate.

In an embodiment, the dielectric plate unit may further include a first base arranged between the dielectric plate and the temperature control plate, and the upper electrode unit may further include a second base surrounding the first base and arranged between the upper electrode and the temperature control plate, when viewed from the top.

In an embodiment, the gas supply unit may include a gas channel formed in a space where the first base and the second base are separated from each other, and a first gas supply unit configured to supply a process gas excited by plasma to the gas channel, and a discharge end of the gas channel may be oriented toward an edge region of the substrate supported by the support unit.

In an embodiment, the gas supply unit may include a gas flow path provided in the dielectric plate and a second gas supply unit configured to supply an inert gas to the gas flow path, and the discharge end of the gas flow path may be formed toward a center region of the support supported by the support unit.

The present disclosure also provides a method of aligning a dielectric plate. In an embodiment, the method of aligning the dielectric plate includes aligning the dielectric plate at a preset position with respect to a support unit before or after treating the substrate in the treatment space, in which when the dielectric plate is not aligned at the preset position, any one of the plurality of aligning bolts is tightened to move the upper electrode unit to left and right, thus aligning the dielectric plate at the preset position.

In an embodiment, the aligning unit may be provided to be attachable to or removable from the lid.

In an embodiment, the lid and the upper electrode unit may be bolt-coupled to each other, the lid and the upper electrode unit may be completely coupled to each other during treatment of the substrate in the treatment space, and the lid and the upper electrode unit may be loosely coupled to each other during alignment of the dielectric plate.

In an embodiment, the preset position may be a position where the dielectric plate is aligned at a position where the support unit is placed, during treatment of the substrate in the treatment space.

In an embodiment, any one of the plurality of aligning bolts is tightened to place a view port penetrating the dielectric plate unit and an aligning mark provided on the support unit to correspond to the view port on a straight line.

Advantageous Effects of Disclosure

According to an embodiment of the present disclosure, a substrate may be efficiently treated.

In addition, according to an embodiment of the present disclosure, plasma treatment may be uniformly performed on the substrate.

Moreover, according to an embodiment of the present disclosure, the efficiency of plasma treatment on an edge region of the substrate may be further improved.

Effects of the present disclosure are not limited to the above-described effects, and the effects not mentioned may be clearly understood by those of ordinary skill in the art to which the present disclosure belongs from the present specification and the accompanying drawings.

MODE OF DISCLOSURE

Figure 1:
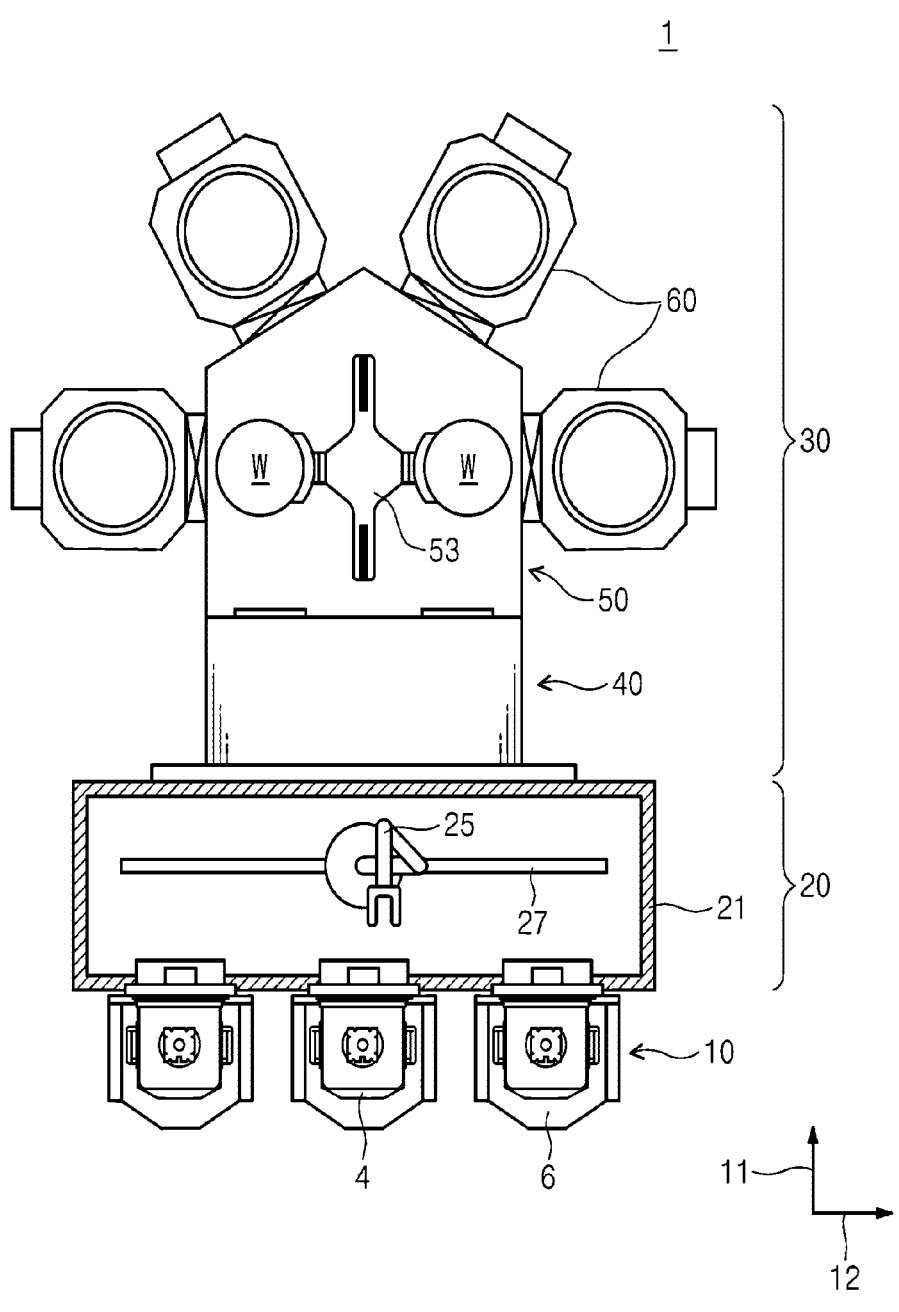
FIG. 1 schematically shows substrate treatment equipment according to an embodiment of the present disclosure.

Hereinafter, examples of the present disclosure will be described in detail with reference to the attached drawings to allow those of ordinary skill in the art to easily carry out the examples of the present disclosure. However, the present disclosure may be implemented in various different forms, and are not limited to the embodiments of the present disclosure described herein. In addition, in describing a preferred embodiment of the present disclosure in detail, when it is determined that a detailed description of a related known function or configuration may unnecessarily obscure the gist of the present disclosure, the detailed description will be omitted. Moreover, the same reference numerals are used for parts having similar functions and actions throughout the drawings.

When a portion is referred to as "includes" a component, the portion may not exclude another component but may further include another component unless stated otherwise. More specifically, it should be understood that the term "include", "have", or the like used herein is to indicate the presence of features, numbers, steps, operations, elements, parts, or a combination thereof described in the specifications, and does not preclude the presence or addition of one or more other features, numbers, steps, operations, elements, parts, or a combination thereof.

Singular forms include plural forms unless apparently indicated otherwise contextually. In addition, the shapes and sizes of components in the drawings may be exaggerated for the clearer description.

FIG. 1 schematically shows substrate treatment equipment according to an embodiment of the present disclosure. Referring to FIG. 1, substrate treatment equipment 1 may include an equipment front end module (EFEM) 20 and a treatment module 30. The EFEM 20 and the treatment module 30 may be arranged in one direction.

The EFEM 20 may include a load port 10 and a transfer frame 21. The load port 10 may be arranged in front of the EFEM 20 in a first direction 11. The load port 10 may include a plurality of supports 6. Each support 6 may be arranged in a line in a second direction 12, and a carrier 4 (e.g., a cassette, front-opening unified pod (FOUP), etc.) having stored therein a substrate W to be provided to a process and a substrate W having been processed may be nested on the support 6. In the carrier 4, the substrate W to be provided to the process and the substrate W having been processed are stored. The transfer frame 21 may be between the load port 10 and the treatment module 30. The transfer frame 21 may include a first transfer robot 25 arranged therein to transfer the substrate W between the load port 10 and the treatment module 30. The first transfer robot 25 may transfer the substrate W between the carrier 4 and the treatment module 30 by moving a transfer rail 27 provided in the second direction 12.

The treatment module 30 may include a load lock chamber 40, a transfer chamber 50, and a process chamber 60. The treatment module 30 may receive the substrate W returned from the EFEM 20 to treat the substrate W.

The load lock chamber 40 may be arranged adjacent to the transfer frame 21. For example, the load lock chamber 40 may be arranged between the transfer chamber 50 and the EFEM 20. The load lock chamber 40 may provide a space for allowing the substrate W to be provided to the process to wait before the substrate W is transferred to the process chamber 60, or allowing the substrate W having been processed to wait before the substrate W is transferred to the EFEM 20.

The transfer chamber 50 may return the substrate W. The transfer chamber 50 may be arranged adjacent to the load lock chamber 40. The transfer chamber 50 may have a polygonal body when viewed from the top. Referring to FIG. 1, the transfer chamber 50 may have a pentagonal body when viewed from the top. On the exterior of the body, the load lock chamber 40 and a plurality of process chambers 60 may be arranged along the circumference of the body. A path (not shown) through which the substrate W enters and exits may be formed on each sidewall of the body, and the path may connect the transfer chamber 50 with the load lock chamber 40 or the process chambers 60. In each path, a door (not shown) for sealing the interior by opening and closing the path may be provided. In an inner space of the transfer chamber 50, a second transfer robot 53 may be arranged to transfer the substrate W between the load lock chamber 40 and the process chambers 60. The second transfer robot 53 may transfer the non-processed substrate W waiting in the load lock chamber 40 to the process chamber 60 or transfer the processed substrate W to the load lock chamber 40. To sequentially provide the substrate W to the plurality of process chambers 60, the substrate W may be transferred between the process chambers 60. When the transfer chamber 50 has a pentagonal body as shown in FIG. 1, the load lock chamber 40 may be arranged on a sidewall adjacent to the EFEM 20 and the process chambers 60 may be consecutively arranged on the other sidewalls. The transfer chamber 50 may be provided in not only the above-described shape, but also various shapes according to a required processing module.

The process chamber 60 may be arranged adjacent to the transfer chamber 50. The process chamber 60 may be arranged along the circumference of the transfer chamber 50. The process chamber 60 may be provided in plural. In each process chamber 60, processing with respect to the substrate W may be performed. The process chamber 60 may receive the substrate W from the second transfer robot 53 to process the substrate W, and provide the processed substrate W to the second transfer robot 53. Processing performed in the respective process chambers 60 may be different.

Hereinbelow, an apparatus for treating a substrate to perform plasma processing in the process chamber 60 will be described in detail. Moreover, it will be described below as an example that the apparatus for treating a substrate is configured to perform plasma treatment processing with respect to an edge region of the substrate in the processing chamber 60. However, without being limited to the example, the apparatus for treating a substrate described below may be equally or similarly applied to various chambers where treatment on the substrate is performed. Moreover, the apparatus for treating a substrate may be equally or similarly applied to various chambers where plasma treatment processing on the substrate is performed.

Figure 2:
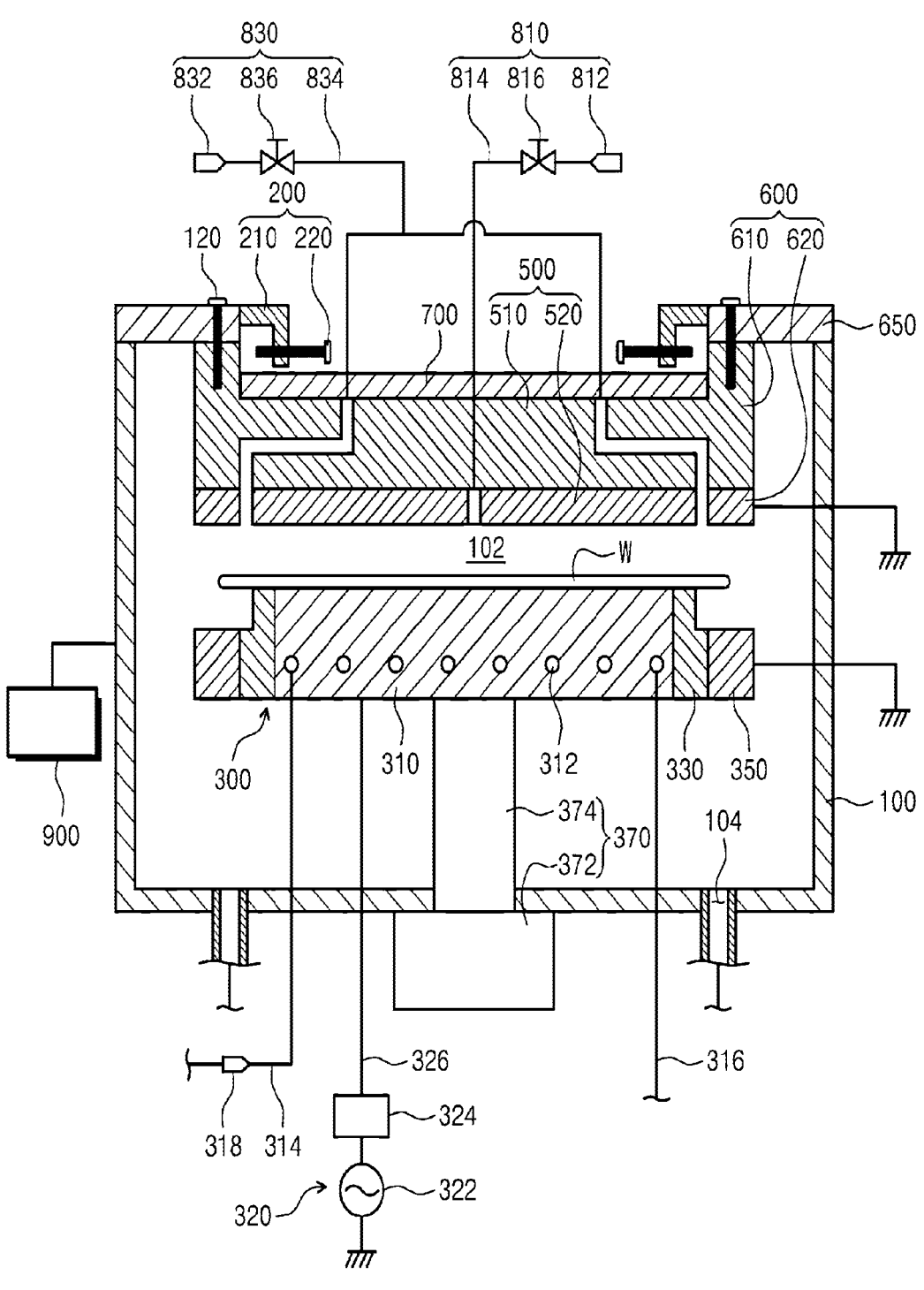
FIG. 2 illustrates an example of an apparatus for treating a substrate, provided in a process chamber of FIG. 1.

FIG. 2 illustrates an example of an apparatus for treating a substrate, provided in a process chamber of FIG. 1. Referring to FIG. 2, the apparatus for treating a substrate, provided in the process chamber 60, may perform processing on the substrate W by using plasma. For example, the apparatus for treating a substrate may etch or ash a film material. The film material may include various types of film materials such as a polysilicon film, a silicon oxide film, a silicon nitride film, etc. The film material may also be a natural oxide film or a chemically generated oxide film. In addition, the film material may be a by-product generated during treatment of the substrate W. The film material may be impurities attached to and/or remaining on the substrate W.

The apparatus for treating a substrate may perform plasma processing on the substrate W. For example, the apparatus for treating a substrate may supply a process gas and generate plasma from the supplied process gas to treat the substrate W. The apparatus for treating a substrate may supply a process gas and generate plasma from the supplied process gas to treat the edge region of the substrate W. Hereinafter, a description will be made using an example where the apparatus for treating a substrate is a bevel etching apparatus that performs etching for the edge region of the substrate W.

The apparatus for treating a substrate may include a housing 100, a support unit 300, a dielectric plate unit 500, an upper electrode unit 600, a temperature control plate 700, a gas supply unit 800, and an aligning unit 200.

The housing 100 may include a treatment process 102 therein. An opening (not shown) may be formed on a surface of the housing 100. In an example, an opening may be formed in any one of side surfaces of the housing 100. The substrate W may be carried into or out of the treatment space 102 of the housing 100 through the opening formed in the housing 100. The opening may be opened and closed by an opening/closing member such as the door (not shown).

In an example, the housing 100 may be provided in a form having an open top thereof. The housing 100 may form a space sealed by a lid 650 described below, the upper electrode unit 600, and the dielectric plate unit 500. When the opening of the housing 100 is opened and closed by the opening/closing member, the treatment space 102 of the housing 100 may be isolated from the outside. In addition, the atmosphere of the treatment space 102 of the housing 100 may be adjusted to low pressure close to vacuum after isolation from the outside. Moreover, the housing 100 may be provided as a material including metal. In addition, the surface of the housing 100 may be coated with an insulating material.

An exhaust hole 104 may be formed in a bottom surface of the housing 100. Plasma P generated in the treatment space 212 or gases G1 and G2 supplied to the treatment space 212 may be exhausted outside through the exhaust hole 104. Moreover, by-products generated in a process of treating the substrate W by using the plasma P may be exhausted outside through the exhaust hole 104. The exhaust hole 104 may be connected to an exhaust line (not shown). The exhaust line may be connected to a decompression member providing decompression. The decompression member may provide decompression to the treatment space 102 through the exhaust line.

The support unit 300 may support the substrate W in the treatment space 102. The support unit 300 may include a chuck 310, a power source member 320, an insulating ring 330, a lower electrode 350, and a driving member 370.

The chuck 310 may have a support surface supporting the substrate W. The chuck 310 may have a circular shape when viewed from the top. The chuck 310 may have a diameter less than the substrate W when viewed from the top. Thus, the center region of the substrate W supported by the chuck 310 may be nested on the support surface of the chuck 310, and the edge region of the substrate W may not meet the support surface of the chuck 310.

A heating means (not shown) may be provided inside the chuck 310. The heating means (not shown) may heat the chuck 310. The heating means may be a heater. In addition, a cooling flow path 312 may be formed in the chuck 310. The cooling flow path 312 may be formed inside the chuck 310. A cooling fluid supply line 314 and a cooling fluid discharge line 316 may be connected to the cooling flow path 312. The cooling fluid supply line 314 may be connected to a cooling fluid supply source 318. The cooling fluid supply source 318 may store cooling fluid and/or the cooling fluid to the cooling fluid supply line 314. In addition, the cooling fluid supplied to the cooling flow path 312 may be discharged outside through the cooling fluid discharge line 316. Cooling fluid stored and/or supplied by the cooling fluid supply source 318 may be cooling water or cooling gas. The shape of the cooling flow path 312 formed in the chuck 310 may be variously changed without being limited to the shape shown in FIG. 2. A structure for cooling the chuck 310 may be various structures (e.g., a cooling plate, etc.) capable of cooling the chuck 310 without being limited to a structure for supplying cooling fluid.

The power source member 320 may supply power to the chuck 310. The power source member 320 may include a power source 322, a matcher 324, and a power line 326. The power source 322 may be a bias power source. The power source 322 may be connected with the chuck 310 through the power source line 326. The matcher 324 may be provided to the power source line 326 to perform impedance matching.

The insulating ring 330 may be provided to have a ring shape, when viewed from the top. The insulating ring 330 may be provided surround the chuck 310, when viewed from the top. For example, the insulating ring 330 may have a ring shape. The insulating ring 330 may be stepped such that the height of a top surface of an inner region and the height of a top surface of an outer region are different from each other. For example, the insulating ring 330 may be stepped such that the height of the top surface of the inner region is higher than the height of the top surface of the outer region. When the substrate W is nested on the support surface of the chuck 310, the top surface of the inner region of the insulating ring 330 may contact a bottom surface of the substrate W. When the substrate W is nested on the support surface of the chuck 310, the top surface of the outer region of the insulating ring 330 may be separated from the bottom surface of the substrate W. The insulating ring 330 may be provided between the chuck 310 and the lower electrode 350 described below. A bias power source is provided to the chuck 310 such that the insulating ring 330 may be provided between the chuck 310 and the lower electrode 350 described below. The insulating ring 330 may be provided as an insulating material.

The lower electrode 350 may be arranged under the edge region of the substrate W supported by the chuck 310. The lower electrode 350 may be provided to have a ring shape, when viewed from the top. The lower electrode 350 may be provided to surround the insulating ring 330, when viewed from the top. The top surface of the lower electrode 350 may be provided at the same height as an outer top surface of the insulating ring 330. The bottom surface of the lower electrode 350 may be provided at the same height as the bottom surface of the insulating ring 330. In addition, the top surface of the lower electrode 350 may be provided lower than the top surface of the center portion of the chuck 310. The lower electrode 350 may be provided spaced apart from the bottom surface of the substrate W supported by the chuck 310. For example, the lower electrode 350 may be provided spaced apart from the bottom surface of the edge region of the substrate W supported by the chuck 310.

The lower electrode 350 may be arranged to oppose an upper electrode 620 described later. The lower electrode 350 may be arranged under the upper electrode 620 described later. The lower electrode 350 may be grounded. The lower electrode 350 may increase plasma density by inducing coupling of a bias power source applied to the chuck 310. Thus, the efficiency of treatment on the edge region of the substrate W may be improved.

The driving member 370 may lift the chuck 310. The driving member 370 may include a driver 372 and an axis 374. The axis 374 may be coupled with the chuck 310. The axis 374 may be connected with the driver 372. The driver 372 may lift the chuck 310 in an up-down direction through the axis 374.

The dielectric plate unit 500 may include a dielectric plate 520 and a first base 510. The dielectric plate unit 500 may be coupled with the temperature control plate 700 described later.

The dielectric plate 520 may have a circular shape when viewed from the top. In an example, the bottom surface of the dielectric plate 520 may be provided in a flat shape. The dielectric plate 520 may be arranged to oppose the substrate W supported by the support unit 300 in the treatment space 102. For example, the dielectric plate 520 may be arranged on the support unit 300. The dielectric plate 520 may be provided as a material including ceramic. In the dielectric plate 520, a gas flow path connected to a first gas supply unit 810 of the gas supply unit 800 described below may be formed. In addition, a discharge end of the gas flow path may be structured such that the first gas G1 supplied by the first gas supply unit 810 may be supplied to the center region of the substrate W supported by the support unit 300. The discharge end of the gas flow path may also be structured such that the first gas G1 is supplied to the top surface of the center region of the substrate W supported by the support unit 300.

The first base 510 may be arranged between the dielectric plate 520 and the temperature control plate 700 described later. The first base 510 may be coupled to the temperature control plate 700 described below, and the dielectric plate 520 may be coupled with the first base 510. Thus, the dielectric plate 520 may be coupled with the temperature control plate 700 through the first base 510.

In an example, the top surface of the first base 510 may have a less diameter than the bottom surface of the dielectric plate 520. The top surface of the first base 510 may have a flat shape. The bottom surface of the first base 510 may have a stepped shape. For example, the bottom surface of the edge region of the first base 510 may be stepped such that the height of the bottom surface of the edge region is less than the height of the bottom surface of the center region of the first base 510. The bottom surface of the first base 510 and the top surface of the dielectric plate 520 may have shapes combinable with each other. In an example, the first base 510 may be provided as a material including metal. For example, the first base 510 may be provided as a material including aluminum.

The upper electrode unit 600 may include a second base 610 and an upper electrode 620. In addition, the upper electrode unit 600 may be coupled to the temperature control plate 700 described below.

The upper electrode 620 may oppose the above-described lower electrode 350. The upper electrode 620 may be arranged on the lower electrode 350. The upper electrode 620 may be arranged on the edge region of the substrate W supported by the chuck 310. The upper electrode 620 may be grounded.

The upper electrode 620 may have a shape surrounding the dielectric plate 520, when viewed from the top. In an example, the upper electrode 620 may be provided in the shape of a ring. The upper electrode 620 may be separated from the dielectric plate 520 to form a separating space. The separating space may form a part of a gas channel in which the second gas G2 supplied by the second gas supply unit 830 described below flows. The discharge end of the gas channel may be structured such that the second gas G2 may be supplied to the edge region of the substrate W supported by the support unit 300. The discharge end of the gas channel may also be structured such that the second gas G2 may be supplied to the top surface of the edge region of the substrate W supported by the support unit 300.

The second base 610 may be arranged between the upper electrode 620 and the temperature control plate 700 described later. The second base 610 may be coupled to the temperature control plate 700 described below, and the upper electrode 620 may be coupled with the second base 610. Thus, the upper electrode 620 may be coupled with the temperature control plate 700 through the second base 610.

The second base 610 may have a ring shape, when viewed from the top. The top surface and the bottom surface of the second base 610 may have a flat shape. When viewed from the top, the second base 610 may have a shape surrounding the first base 510. In an example, an inner surface of the second base 610 may have a shape combined with an outer surface of the first base 510. The second base 610 may be provided to be separated from the first base 510. The second base 610 may be separated from the first base 510 to form a separating space. The separating space may form a part of a gas channel in which the second gas G2 supplied by the second gas supply unit 830 described below flows. In an example, the second base 610 may be provided as a material including metal. For example, the second base 610 may be provided as a material including aluminum.

The temperature control plate 700 may be coupled to the dielectric plate unit 500 and the upper electrode unit 600. The temperature control plate 700 may be coupled to the housing 100 through the lid 650 described below. The temperature control plate 700 may generate heat. For example, the temperature control plate 700 may generate hot or cold heat. The temperature control plate 700 may receive a signal from a controller 900 described below to generate heat. The temperature control plate 700 may generate hot heat or cold heat to control the temperatures of the dielectric plate unit 500 and the upper electrode unit 600 to be maintained relatively constant. For example, the temperature control plate 700 may generate cold heat to suppress the temperatures of the dielectric plate unit 500 and the upper electrode unit 600 to the maximum so as not to be excessively high in a process of treating the substrate W.

The gas supply unit 800 may supply gas to the treatment space 102. The gas supply unit 800 may supply the first gas G1 and the second gas G2 to the treatment space 102. The gas supply unit 800 may include a first gas supply unit 810 and a second gas supply unit 830.

The first gas supply unit 810 may supply the first gas G1 to the treatment space 102. The first gas G1 may be an inert gas such as nitrogen, etc. The first gas supply unit 810 may supply the first gas G1 to the center region of the substrate W supported by the chuck 310. The first gas supply unit 810 may include a first gas supply source 812, a first gas supply line 814, and a first valve 816. The first gas supply source 812 may store the first gas G1 and/or supply the first gas G1 to the first gas supply line 814. The first gas supply line 814 may be connected with a flow path formed on the dielectric plate 520. The first valve 816 may be installed in the first gas supply line 814. The first valve 816 may be an on/off valve or a flow control valve. The first gas G1 supplied by the first gas supply source 812 may be supplied to the center region of the top surface of the substrate W through the flow path formed on the dielectric plate 520.

The second gas supply unit 830 may supply the second gas G2 to the treatment space 102. The second gas G2 may be a process gas that is excited to a plasma state. The second gas supply unit 830 may supply the second gas G2 to the edge region of the substrate W through a gas channel formed by separation between the dielectric plate 520, the first base 510, the upper electrode 620, and the second base 610, provided on the edge region of the substrate W supported by the chuck 310. The second gas supply unit 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to a separating space functioning as a gas channel. The second valve 836 may be installed in the second gas supply line 834. The second valve 836 may be an on/off valve or a flow control valve. The second gas G2 supplied by the second gas supply source 832 may be supplied to the edge region of the top surface of the substrate W through the second flow path 602.

The controller 900 may control the apparatus for treating a substrate. The controller 900 may control the apparatus for treating a substrate to perform plasma treatment processing process performed as below. For example, the controller 900 may control the gas supply unit 800, the temperature control plate 700, and the support unit 300. For example, the controller 900 may control the support unit 300 and the gas supply unit 800 to generate the plasma P in the edge region of the substrate W supported by the chuck 310 by application of power to the chuck 310 from the power source 322 when the first gas supply unit 810 and/or the second gas supply unit 830 supplies gas.

The aligning unit 200 may align a horizontal arrangement of the dielectric plate unit 500. In an example, the aligning unit 200 may be coupled to the lid 650. The upper electrode unit 600 may be coupled to the lid 650. The lid 650 may be provided on the housing 100, and may extend in a horizontal direction from the housing 100 toward an inner space of the housing 100. In an example, the housing 100 may be provided in a cylindrical shape having an open top, and the lid 650 may be provided in a ring shape. In an example, the lid 650 may be provided as the same material as the housing 100. In an example, the lid 650 and the housing 100 may be grounded.

In an example, the bottom surface of the lid 650 may be provided at a position higher than the top surface of the temperature control plate 700.

In an example, the aligning unit 200 may include a body 210 and an aligning bolt 220. The body 210 may be coupled to the lid 650. In an example, the body 210 may be provided in a form to be attachable to/removable from the lid 650. Thus, when the horizontal arrangement of the dielectric plate unit 500 is aligned, the body 210 may be attached, and in a process of treating the substrate W in the housing 100, the body 210 may be in a state of being removed from the lid 650. In an example, the body 210 may be coupled to an inner diameter of the lid 650. The bottom surface of the body 210 may be coupled so as to be separated from the top surface of the temperature control plate 700.

In an example, the cross-section of the body 210 may be provided to have a horizontal portion that is horizontal to the lid 650 and a bent portion bent from the horizontal portion. For example, the cross-section of the body 210 may be provided in the shape of '⌐'. In the bent portion, a thread may be formed in a direction parallel to the horizontal portion. The aligning bolt 220 may be provided to be inserted into the thread formed in the bent portion. An end of the aligning bolt 220 may be provided to selectively contact the upper electrode unit 600. The aligning unit 200 may precisely move the upper electrode unit 600 coupled to the lid 650 in the horizontal direction to align the horizontal arrangement of the dielectric plate unit 500 coupled to the upper electrode unit 600. In an example, the end of the aligning bolt 220 may be provided to selectively contact the second base. The end of the aligning bolt 220 may be provided to push the second base in the horizontal direction as the aligning bolt 220 is tightened. In an example, the aligning bolt 220 may be provided in plural. In an example, the aligning bolt 220 may be provided to be symmetric with respect to the center of the lid 650, when viewed from the top. For example, two aligning bolts 220 may be provided at an interval of 180 degrees, when viewed from the top. Thus, any one aligning bolt 220 may push the second base to the right as the aligning bolt 220 is tightened, and the other aligning bolt 220 may push the second base to the left as the aligning bolt 220 is tightened. On the other hand, the aligning bolts 220 may be provided in more than two at an interval of the same angle, when viewed from the top.

In an example, the lid 650 and the upper electrode unit 600 may be provided to selectively provide a coupling force between the lid 650 and the upper electrode unit 600. For example, the lid 650 and the upper electrode unit 600 may be coupled by the bolt 120. On the other hand, the lid 650 and the upper electrode unit 600 may be coupled by other means capable of variably providing a coupling force therebetween. Thus, when the horizontal arrangement of the dielectric plate unit 500 is aligned, a coupling force between the lid 650 and the upper electrode unit 600 may be provided relatively weak such that the end of the aligning bolt 220 moves the upper electrode unit 600 by pushing the upper electrode unit 600, and when the substrate W is treated in the treatment space 102, the coupling force between the lid 650 and the upper electrode unit 600 may be provided strong to seal the treatment space 102 such that the treatment space 102 may enter a vacuum state.

In the above-described example, it is described that the lid 650 is provided as a part that is separate from the housing 100, but the lid 650 may be provided integrally with the housing 100.

Figure 3:
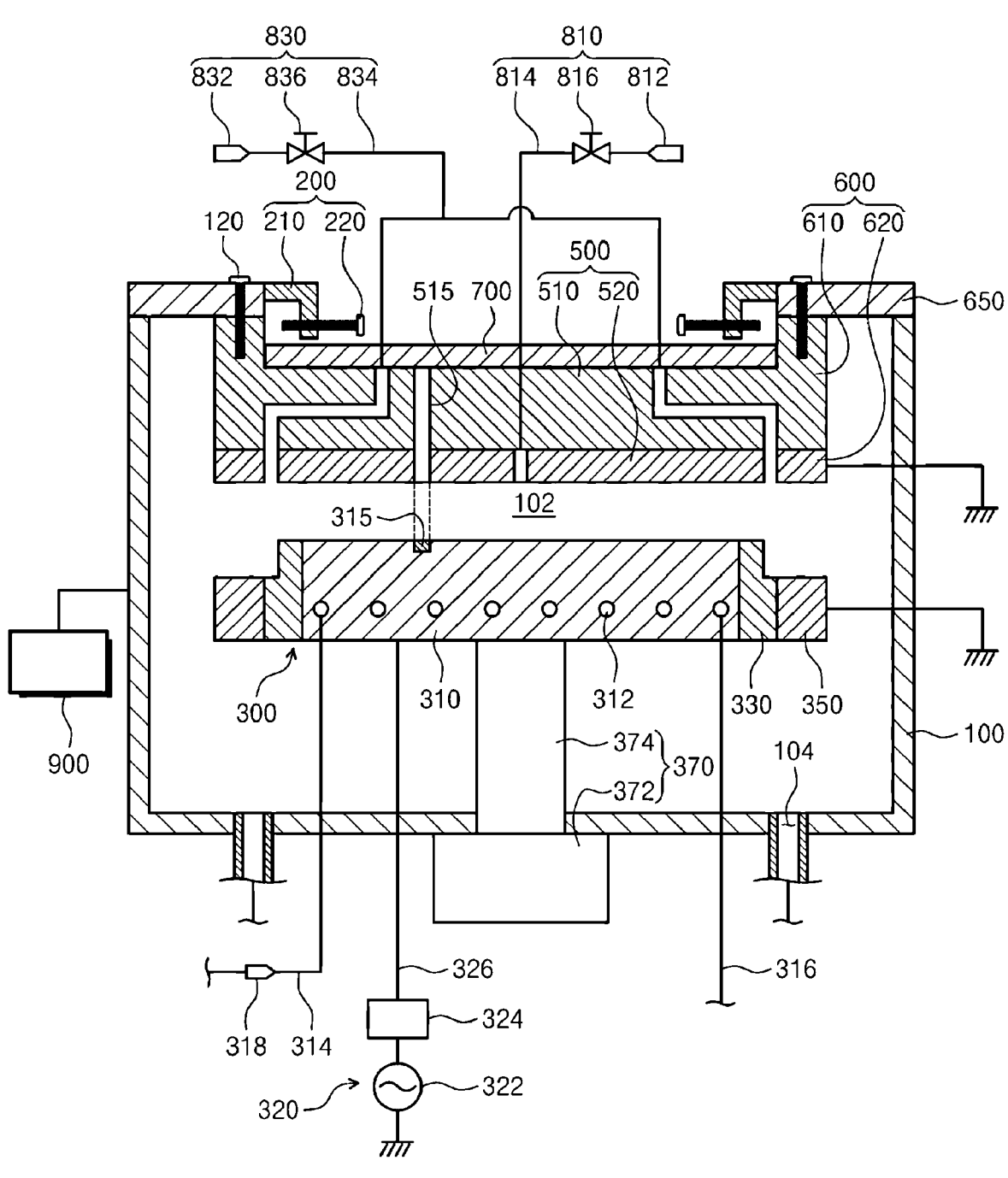
FIG. 3 shows a state of an apparatus for treating a substrate, according to an embodiment of the present disclosure.

FIG. 3 shows a state of an apparatus for treating the substrate W, according to an embodiment of the present disclosure. In an example, a view port 515 may be provided in the dielectric plate unit 500, and an aligning mark 315 may be provided in the support unit 300.

The view port 515 may be provided to penetrate the dielectric plate unit 500. When viewed from the top, the view port 515 may be provided at a position that does not overlap with the lid 650. Thus, the view port 515 may be provided to allow an operator to look into the treatment space 102 with the naked eye therethrough. The aligning mark 315 may be provided to correspond to the view port 515 at a preset position. In an example, the preset position may be a position of the support unit 300 during treatment of the substrate W in the treatment space 102. In an example, the aligning mark 315 may be provided as a groove in the support unit 300. In contrast, the aligning mark 315 may be provided in various forms that the operator may visually check with the naked eye. The operator may determine that the dielectric plate unit 500 is aligned in the right position when the aligning mark 315 may be identified through the view port 515 with the naked eye. When the aligning mark 315 may not be identified with the naked eye, the aligning bolt 220 may be controlled to place the view port 515 and the aligning mark 325 on a straight line, thus moving the dielectric plate unit 500 in the horizontal direction.

Hereinbelow, a method of aligning the dielectric plate 520 according to the present disclosure will be described with reference to FIGS. 4 to 6.

In an example, the dielectric plate 520 may be aligned at a preset position with respect to the support unit 300 before or after the substrate W is treated in the treatment space 102. Before or after the substrate W is processed in the treatment space 102, the dielectric plate 520 may be aligned in a state where the substrate W is not provided in the treatment space 102. In an example, treatment of the substrate W may be bevel etching that treats the edge region of the substrate W.

Figure 4:
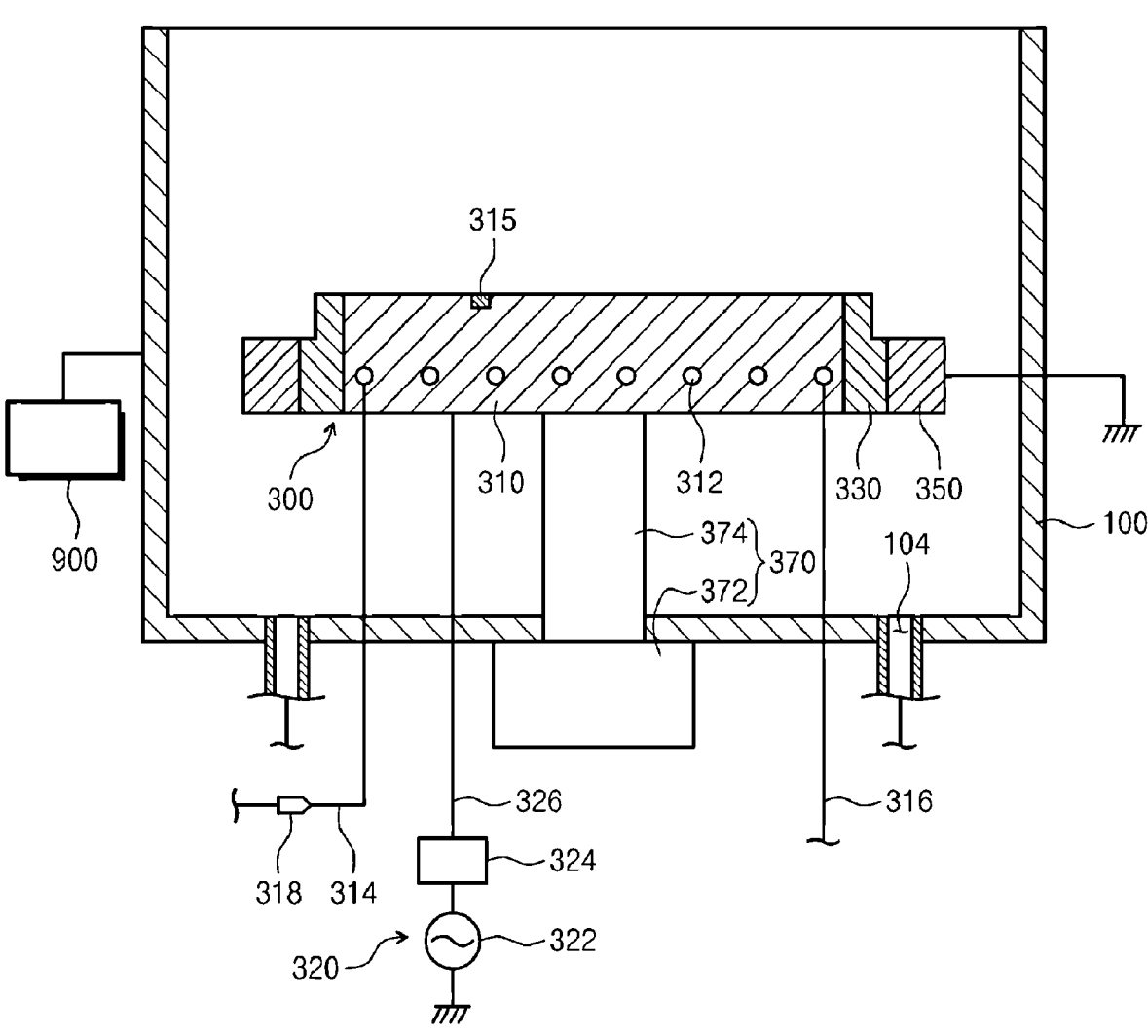
FIGS. 4 to 6 each show a state in which a dielectric plate is aligned, according to an embodiment of the present disclosure.

First, as shown in FIG. 4, before or after the substrate W is treated in the treatment space 102, the dielectric plate unit 500 or the upper electrode unit 600 may be removed from the housing 100 for maintenance of the dielectric plate unit 500 or the upper electrode unit 600. In this case, the lid 650 may be removed together with the dielectric plate 500 and the upper electrode unit 600. Alternatively, the lid 650 may not be removed.

Figure 5:
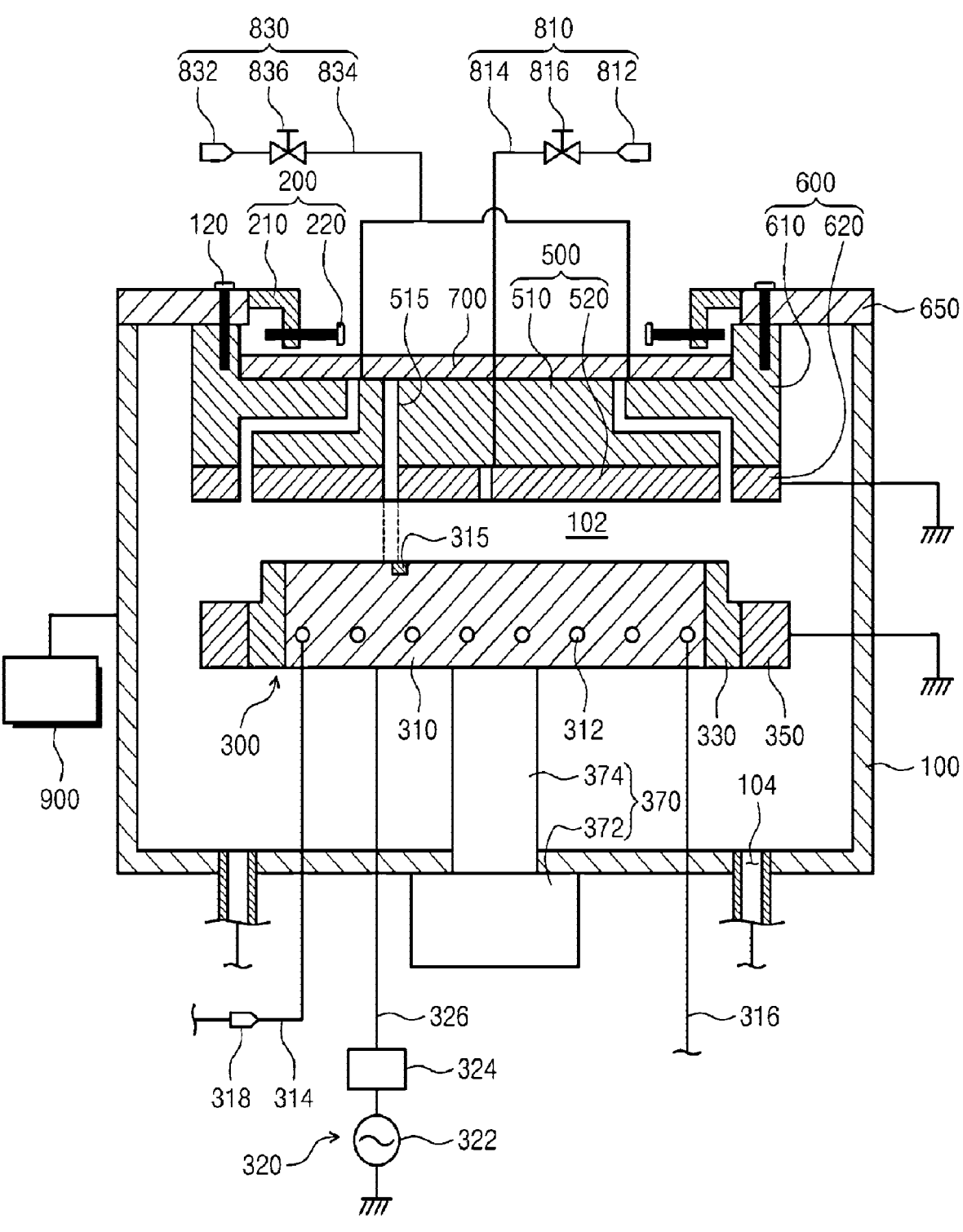
Figure 6:
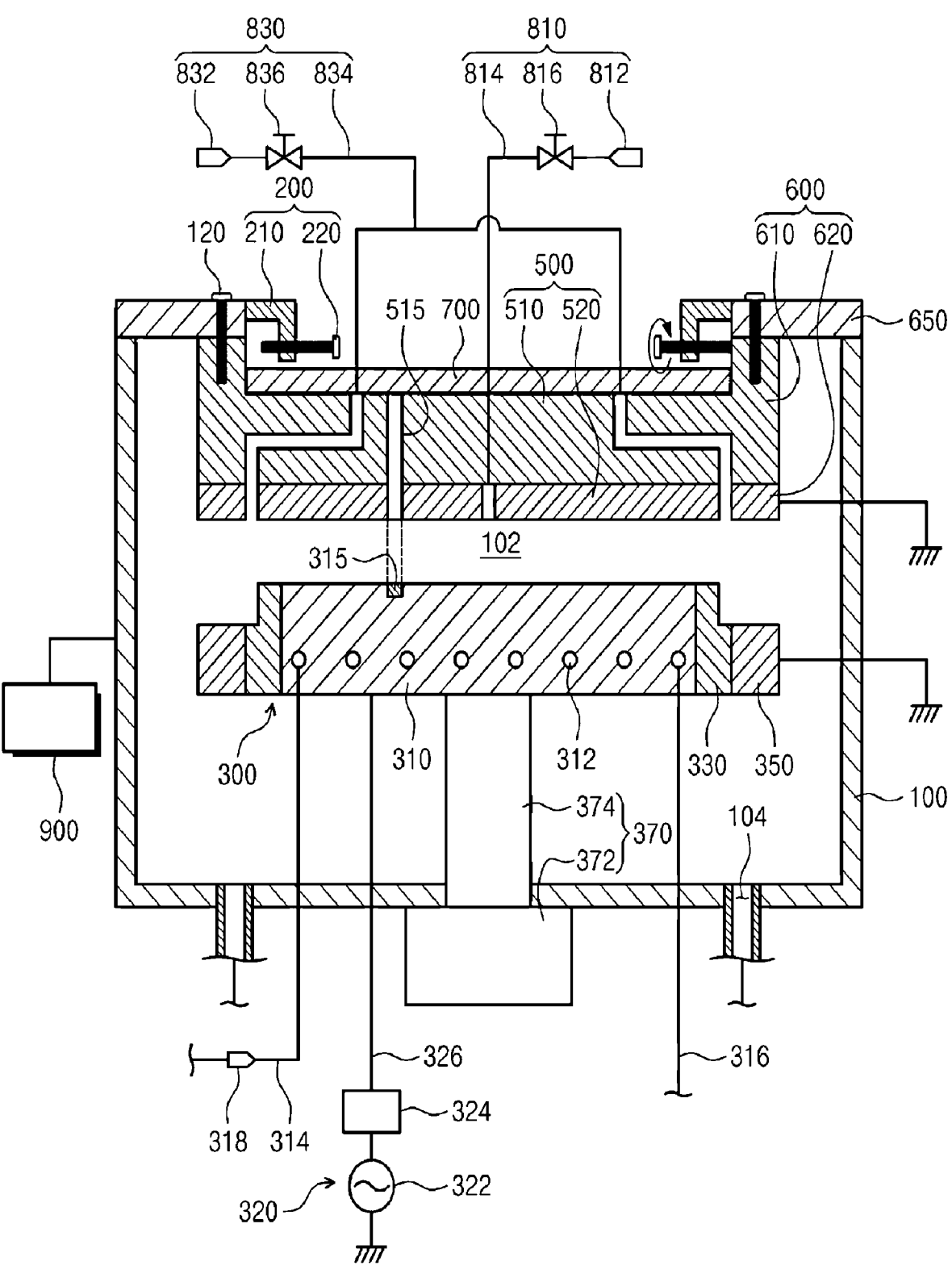

Thereafter, as shown in FIG. 5, the lid 650, the dielectric plate unit 500, and the upper electrode unit 600 may be coupled to the housing 100. Then, the aligning unit 200 is coupled to the lid 650. The position of the dielectric plate unit 500 may serve as an important factor for etching the edge region of the substrate W. In particular, when the dielectric plate 520 is not at the right position, the edge region of the substrate W may be etched with respect to the center of the substrate W in an imbalanced manner. Thus, it is necessary to align the dielectric plate 520 at the right position with respect to the center of the substrate W. However, the substrate W is not in the treatment space 102 during non-treatment of the substrate W, such that the horizontal position of the dielectric plate 520 may be aligned with respect to the support unit 300 on which the substrate W is placed. In an example, the horizontal position of the dielectric plate 520 may be aligned with respect to a position where the support unit 300 is placed during treatment of the substrate W in the treatment space 102.

For example, as shown in FIG. 5, when the dielectric plate 520 is not aligned at the preset position, the aligning mark 315 may not be identified when the operator looks into the treatment space 102 through the view port 515 with the naked eye from the top. In this case, the operator may tighten any one of the aligning bolts 220 to align the dielectric plate 520 at the preset position by moving the dielectric plate 520 to the left and right when viewing the upper electrode unit 600 from the top. In this case, the lid 650 and the upper electrode unit 600 are loosely coupled to each other. As shown in FIG. 6, when the aligning mark 315 may be identified through the view port 515, it is determined that the dielectric plate 520 is aligned at the preset right position. When the dielectric plate 520 is aligned at the preset position, the lid 650 and the upper electrode unit 600 may be completely coupled to each other. In an example, a bolt provided between the lid 650 and the upper electrode unit 600 may be firmly tightened. In an example, the operator may continuously identify whether the dielectric plate 520 is aligned at the preset right position while tightening the bolt provided between the lid 650 and the upper electrode unit 600.

In an example, when alignment of the dielectric plate 520 is completed, the aligning unit 200 may be separated from the lid 650.

Figure 7:
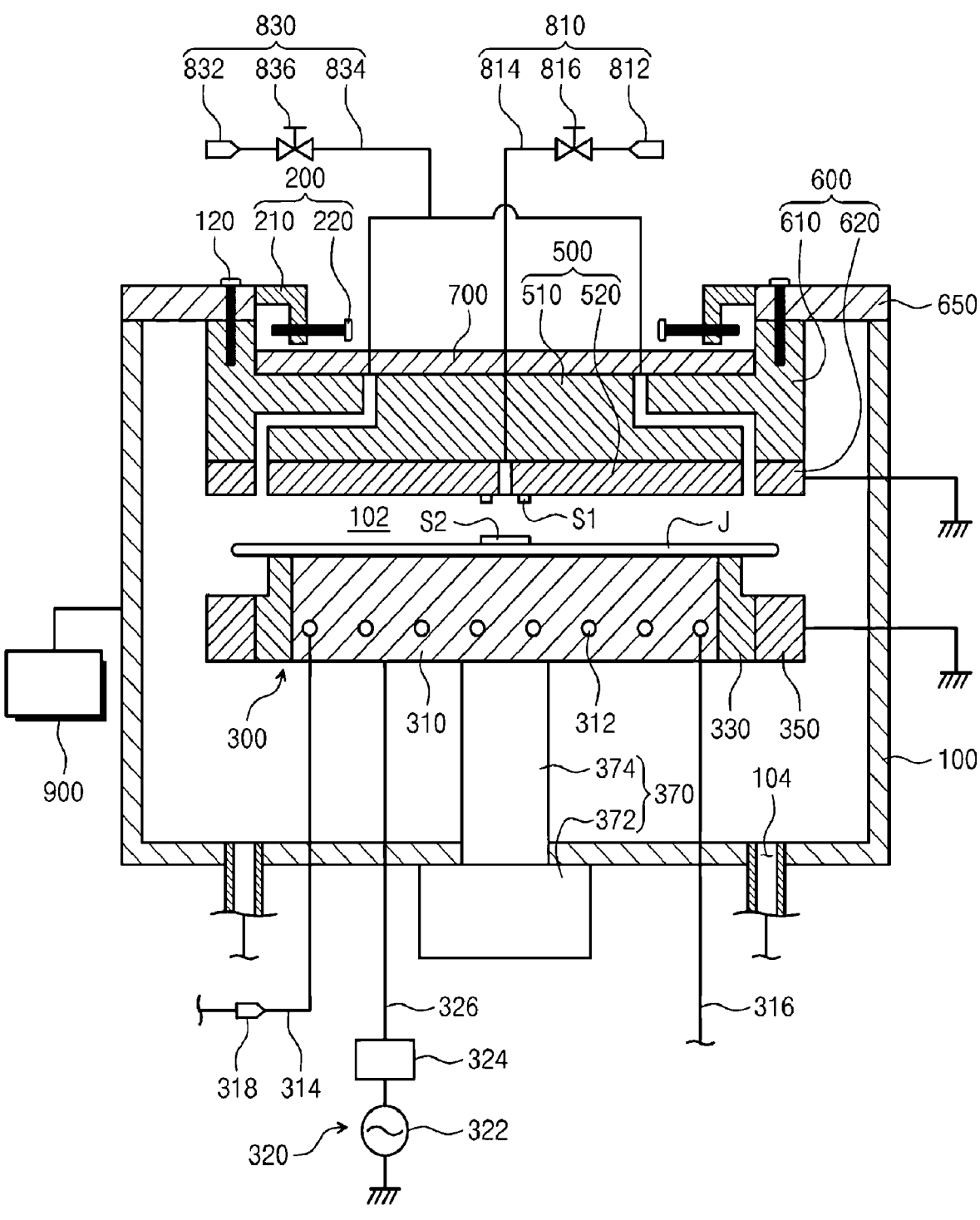
FIG. 7 shows a state of an apparatus for treating a substrate, according to another embodiment of the present disclosure.

In the foregoing example, it is described that the view port 515 may be provided in the dielectric plate unit 500 and the operator may identify the position of the aligning mark 315 provided in the treatment space 102 through the view port 515 with the naked eye so as to align the dielectric plate 520 in the horizontal direction. However, on the other hand, as shown in FIG. 7, a jig J in the same shape as the substrate W having a sensor S2 attached thereto may be taken into the treatment space 102, and a positional relationship with a sensor S1 provided in the treatment space 102 may be received by a controller provided outside the treatment space 102 to align the dielectric plate 520 in the horizontal direction.

In the foregoing example, it is described that the temperature control plate 700 is provided separately. However, on the other hand, the temperature control plate 700 may not be provided separately, and the second base 610 and the temperature control plate 700 may be provided integrally.

According to the present disclosure, when the dielectric plate is positioned on the substrate to treat the edge region of the substrate, the horizontal position of the dielectric plate 520 may be aligned.

According to the present disclosure, the aligning unit 200 for aligning the horizontal position of the dielectric plate 520 may be attached and removed.

While an example is described where the apparatus for treating the substrate performs etching with respect to the edge region of the substrate W, the present disclosure is not limited thereto. The foregoing embodiments may be equally or similarly applied to various facilities and processing requiring treatment of the edge region of the substrate W.

A method of generating the plasma P by the apparatus for treating the substrate described in the foregoing example may be an inductive coupled plasma (ICP) scheme. The above-described method of generating the plasma P by the apparatus for treating the substrate may be a capacitor couple plasma (CCP) scheme. The apparatus for treating the substrate may generate the plasma P by using both the ICP scheme and the CCP scheme or a scheme selected from the ICP scheme and the CCP scheme. The apparatus for treating the substrate may treat the edge region of the substrate W through a known method of generating the plasma P.

The above detailed description exemplifies the present disclosure. In addition, the foregoing description is provided by showing a preferred embodiment of the present disclosure, and the present disclosure may be used in various combinations, changes and environments. That is, it is possible to change or modify within the scope of the concept of the present disclosure disclosed herein and the equivalent range to the foregoing disclosure and/or the range of the technique or knowledge of the art. The above-described embodiment describes the best state for implementing the technical idea of the present disclosure, and may also make various changes required in the specific application field and use of the present disclosure. Therefore, the detailed description of the present disclosure is not intended to limit the present disclosure to the disclosed embodiment. In addition, the accompanying claims should be interpreted as including other embodiments.

The invention claimed is:

1. An apparatus for treating a substrate, the apparatus comprising:

a housing comprising an open top and a treatment space therein;

a gas supply unit, comprising a gas supply source and a gas supply line, configured to supply a gas to the treatment space;

a support unit comprising a chuck configured to support the substrate in the treatment space and a lower electrode configured to surround the chuck when viewed from the open top;

a dielectric plate unit comprising a dielectric plate arranged to oppose the substrate supported by the support unit in the treatment space;

an upper electrode unit coupled to the dielectric plate unit and comprising an upper electrode arranged to oppose the lower electrode; and an aligning unit, comprising a body and a plurality of aligning bolts, configured to align a horizontal arrangement of the dielectric plate unit, wherein a lid extending from the housing in a horizontal direction and coupled to the upper electrode unit, and wherein the lid is provided on the open top of the housing, and the aligning unit is coupled to the lid.

2. The apparatus of claim 1, wherein the body is coupled to the lid, and wherein the plurality of aligning bolts are provided to be inserted into a thread formed on the body and to push the upper electrode unit in the horizontal direction.

3. The apparatus of claim 2, wherein the body is provided in a form to be attachable to and removable from the lid.

4. The apparatus of claim 2, wherein the lid is provided in a ring shape, and the plurality of aligning bolts are provided symmetrically with respect to a center of the lid.

5. The apparatus of claim 1, wherein the lid and the upper electrode unit are bolt-coupled to each other.

6. The apparatus of claim 1, further comprising:

a view port penetrating the dielectric plate unit; and an aligning mark provided on the support unit and aligned with the view port at a preset position.

7. The apparatus of claim 6, wherein the view port is provided at a position that does not overlap with the lid, when viewed from the open top.

8. The apparatus of claim 1, wherein the dielectric plate unit and the upper electrode unit are coupled to a temperature control plate.

9. The apparatus of claim 8, wherein the dielectric plate unit further comprises a first base arranged between the dielectric plate and the temperature control plate, and the upper electrode unit further comprises a second base surrounding the first base and arranged between the upper electrode and the temperature control plate, when viewed from the open top.

10. The apparatus of claim 9, wherein the gas supply unit further comprises:

a gas channel formed in a space where the first base and the second base are separated from each other, wherein, the gas supply source comprises a first gas supply source configured to supply a process gas excited by plasma to the gas channel, and wherein a discharge end of the gas channel is oriented toward an edge region of the substrate supported by the support unit.

11. The apparatus of claim 9, wherein the gas supply unit further comprises:

a gas flow path provided in the dielectric plate, wherein the gas supply source comprises a second gas supply source configured to supply an inert gas to the gas flow path, and wherein a discharge end of the gas flow path is formed toward a center region of the support supported by the support unit.

12. A method of aligning a dielectric plate using the apparatus of treating the substrate of claim 2, the method comprising aligning the dielectric plate at a preset position with respect to the support unit before or after treating the substrate in the treatment space, wherein when the dielectric plate is not aligned at the preset position, any one of the plurality of aligning bolts is tightened to move the upper electrode unit to left and right, thus aligning the dielectric plate at the preset position.

13. The method of claim 12, wherein the aligning unit is provided to be removably attached to the lid.

14. The method of claim 12, wherein the lid and the upper electrode unit are bolt-coupled to each other, the lid and the upper electrode unit are completely coupled to each other during treatment of the substrate in the treatment space, and the lid and the upper electrode unit are loosely coupled to each other during alignment of the dielectric plate.

15. The method of claim 12, wherein the preset position is a position where the dielectric plate is aligned at a position where the support unit is placed, during treatment of the substrate in the treatment space.

16. The method of claim 12, wherein any one of the plurality of aligning bolts is tightened to place a view port penetrating the dielectric plate unit and an aligning mark provided on the support unit to correspond to the view port on a straight line.

\* \* \* \* \*